United States Patent
Fan et al.

(10) Patent No.: US 11,296,143 B2
(45) Date of Patent: Apr. 5, 2022

(54) DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Yong Fan, Shenzhen (CN); Yang Sun, Shenzhen (CN)

( * ) Notice: Subject to any disclaimer, the term of this patent is extended or adjusted under 35 U.S.C. 154(b) by 207 days.

(21) Appl. No.: 16/627,818

(22) PCT Filed: Dec. 27, 2019

(86) PCT No.: PCT/CN2019/129072
§ 371 (c)(1),
(2) Date: Dec. 31, 2019

(87) PCT Pub. No.: WO2021/114416
PCT Pub. Date: Jun. 17, 2021

(65) Prior Publication Data
US 2021/0335882 A1    Oct. 28, 2021

(30) Foreign Application Priority Data
Dec. 13, 2019    (CN) .......................... 201911278576.3

(51) Int. Cl.
*H01L 27/15* (2006.01)
*H01L 33/58* (2010.01)
*H01L 33/60* (2010.01)

(52) U.S. Cl.
CPC ............ *H01L 27/156* (2013.01); *H01L 33/58* (2013.01); *H01L 33/60* (2013.01)

(58) Field of Classification Search
CPC ........ H01L 27/156; H01L 33/58; H01L 33/60
See application file for complete search history.

(56) References Cited

U.S. PATENT DOCUMENTS

| 2007/0145892 A1* | 6/2007 | Chen .................. H01L 51/5271 |
| | | 313/506 |
| 2014/0159043 A1* | 6/2014 | Sakariya ............. H01L 25/0753 |
| | | 257/59 |
| 2017/0033164 A1 | 2/2017 | Liu |
| 2019/0148419 A1 | 5/2019 | Song et al. |
| 2020/0035770 A1 | 1/2020 | Jiang |

FOREIGN PATENT DOCUMENTS

| CN | 107316888 A | 11/2007 |
| CN | 105118928 A | 12/2015 |
| CN | 108511623 A | 9/2018 |
| CN | 109037476 A | 12/2018 |
| CN | 110021647 A | 7/2019 |
| KR | 20190056463 A | 5/2019 |

* cited by examiner

*Primary Examiner* — Jay C Chang
*Assistant Examiner* — Mikka Liu

(57) ABSTRACT

The disclosure provides a display panel, including a substrate layer, a luminescent layer, and a plurality of composite black matrix layers. The luminescent layer is disposed on the substrate layer, the composite black matrix layers are disposed beside two sides of the luminescent layer and are disposed on the substrate layer, and the composite black matrix layers comprise a black matrix layer and a light reflective layer.

10 Claims, 2 Drawing Sheets

DISPLAY PANEL AND DISPLAY DEVICE

FIELD

The present disclosure relates to the field of display panel and, more particularly, relates to a display panel and a display device.

BACKGROUND

Micro light-emitting diodes (micro LEDs) are a novel light-emitting display technology. When compared with organic light-emitting diode (OLED) technology, micro LED displays offer higher brightness, better luminescent efficiency, and lower power consumption. Therefore, micro LED diodes have become a next-generation display technology following OLEDs and are deeply spotlighted and concerned by multiple manufacturers. In micro LEDs, multiple LEDs with a size less than 100 μm are arranged in multiple arrays on a substrate to form multiple LED arrays which have high density and significantly small size.

The most direct way to realize a full-color micro LED display panel is: respectively building red LED chips, green LED chips, and blue LED chips on a substrate, then encapsulating the substrate. In conventional processes of manufacturing a full-color liquid crystal display (LCD), light leakage easily occurs because of too-small distances between red photoresists, green photoresists, and blue photoresists (RGB photoresists), thereby resulting in a low contrast panel. To overcome the above issue, black matrices are generally disposed between the RGB photoresists in a manufacturing process of a color filter to block light leakage regions, thereby improving contrast in a panel.

Referring to FIG. 1, which is a schematic structural view showing a conventional display panel. The conventional display panel includes a substrate 11, and a light-shading layer 12, a buffer layer 13, an active layer 14, an insulating layer 15, a gate layer 16, a source/drain layer 17, a planarization layer 18, a black matrix layer 2, and a luminescent layer 3, which are sequentially disposed on the substrate layer 11. Because self-luminescent LEDs in the luminescent layer 3 are light-emitting chips with six surfaces, light emitted from the luminescent layer 3 will be partially absorbed by the black matrices in a non-display direction near black matrices. Therefore, brightnesses of chips are reduced, thereby affecting luminescent efficiency of devices.

Consequently, it is necessary to develop a novel display panel to overcome defeats of conventional technology.

SUMMARY

An objective of the present disclosure is to provide a display panel that can solve problems that brightnesses of chips are reduced and luminescent efficiency of devices is affected because light emitted from conventional LEDs is partially absorbed by black matrices.

To achieve the above goal, the present disclosure provides a display panel, including a substrate layer, a luminescent layer, and a plurality of composite black matrix layers. The luminescent layer is disposed on the substrate layer, the composite black matrix layers are disposed beside two sides of the luminescent layer and are disposed on the substrate layer, and each of the composite black matrix layers includes a black matrix layer and a light reflective layer.

Furthermore, in other embodiments, the black matrix layer is disposed on the substrate layer, and the light reflective layer covers lateral sides of the black matrix layer. The light reflective layer is disposed on the black matrix layer so that light emitted from the luminescent layer to the black matrix layer can be continuously utilized. Meanwhile, light emitted from the luminescent layer can be prevented from being absorbed by the black matrix layer, thereby increasing utilization rate of light.

Furthermore, in other embodiments, the black matrix layer is disposed on the substrate layer, and the light reflective layer is disposed on the black matrix layer.

Furthermore, in other embodiments, a thickness of the black matrix layer is less than 10 μm.

Furthermore, in other embodiments, a thickness of the black matrix layer is less than 2 μm, and a thickness of the light reflective layer ranges from 2 μm to 8 μm.

Furthermore, in other embodiments, a thickness of the black matrix layer is less than 2 μm, and a thickness of the light reflective layer ranges from 2 μm to 8 μm.

Furthermore, in other embodiments, the light reflective layer is disposed on the substrate layer, and the black matrix layer is disposed on the light reflective layer.

Furthermore, in other embodiments, a thickness of the light reflective layer is greater than a thickness of the luminescent layer.

Furthermore, in other embodiments, a thickness of the black matrix layer is less than 2 μm, and a thickness of the light reflective layer ranges from 2 μm to 8 μm.

Furthermore, in other embodiments, the light reflective layer is made of metals, organic materials, non-organic materials, or other materials with light reflective property.

Furthermore, in other embodiments, the light reflective layer can be formed by patterning methods such as sputtering, evaporation, and photolithography.

Furthermore, in other embodiments, the light reflective layer is made of photoresist materials.

Furthermore, in other embodiments, a micro LED is disposed in the luminescent layer.

Furthermore, in other embodiments, the substrate layer includes a substrate, and a buffer layer, an active layer, an insulating layer, a gate layer, an interlayer dielectric layer, a source/drain layer, and a pixel electrode layer, which are sequentially disposed on the substrate.

To achieve the above goal, the present disclosure further provides a display device, including a main body, and the display panel provided by the present disclosure is disposed on the main body.

Regarding beneficial effects: the present disclosure provides a display panel and a display device, a reflective layer is formed on a black matrix layer. Alternatively, it may also be that the black matrix layer having light-shading effect is disposed on the reflective layer. Compared with conventional technology, in the present disclosure, RGB chips can block light leaking from each other, and the light reflective layer can reflect light emitted from the luminescent layer to upper layers sot that the light can be emitted from the top. As a result, light emitted from the luminescent layer can be prevented from being absorbed by the black matrix layer, thereby increasing brightness and improving luminescent efficiency of devices.

DESCRIPTION OF DRAWINGS

The accompanying figures to be used in the description of embodiments of the present disclosure or prior art will be described in brief to more clearly illustrate the technical solutions of the embodiments or the prior art. Apparently, the accompanying figures described below are only part of the embodiments of the present disclosure, from which figures those skilled in the art can derive further figures without making any inventive efforts.

DETAILED DESCRIPTION

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

The specific structures and detail functions disclosed herein are merely representative and are for purposes of describing exemplary embodiments of the present invention. However, the present invention may be embodied in many alternative forms and should not be construed as being limited to the embodiments set forth herein.

First Embodiment

Figure 1:
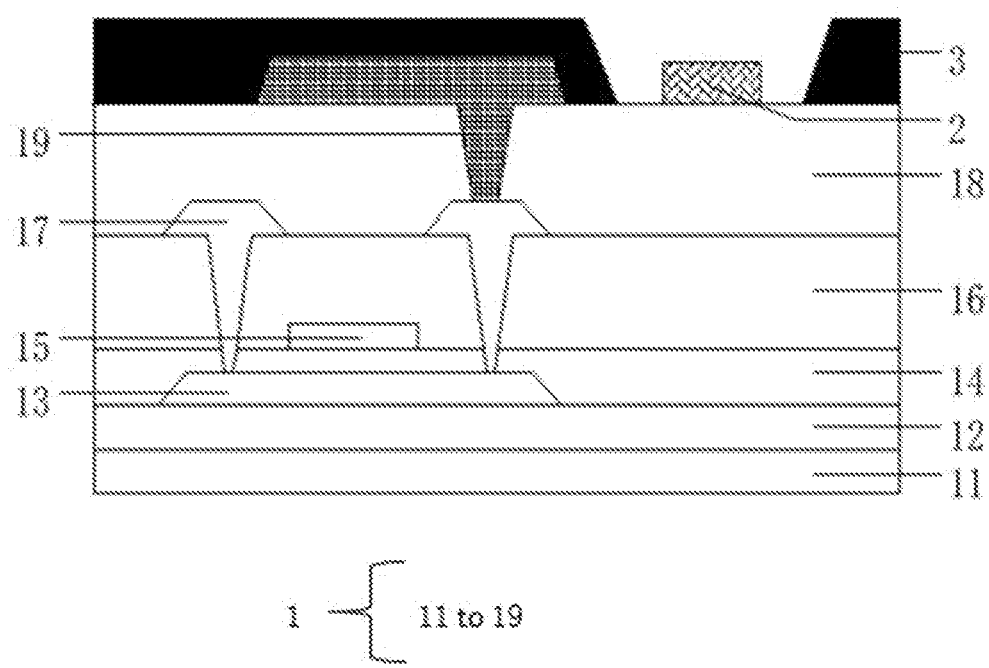
FIG. 1 is a schematic structural view showing a conventional display panel.
Figure 2:
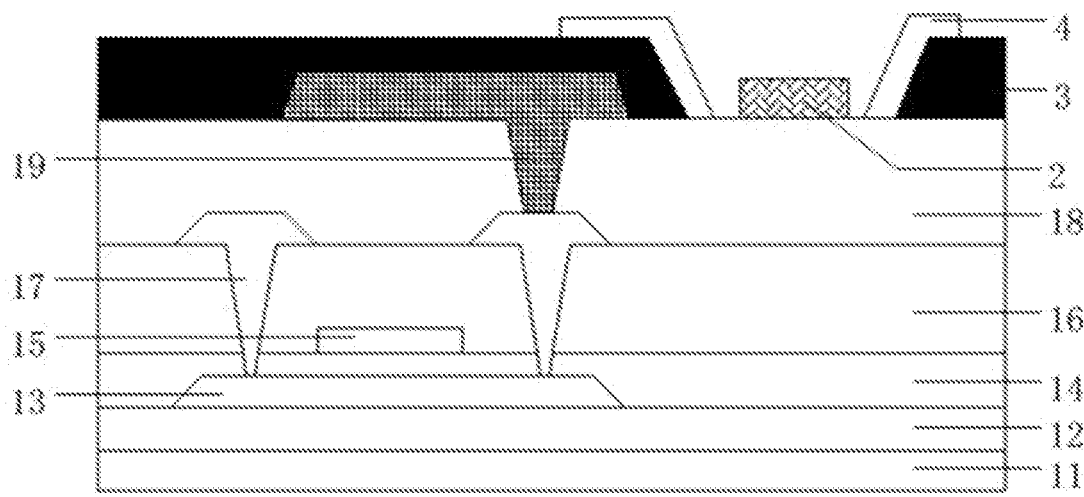
FIG. 2 is a schematic structural view showing a display panel provided by a first embodiment of the present disclosure.

Referring to FIG. 2, which is schematic structural view showing a display panel provided by the present embodiment. To achieve the above goal, the present disclosure provides a display panel, including a substrate layer 1, and a luminescent layer 2, a plurality of black matrix layers 3, and a plurality of light reflective layers 4, which are sequentially disposed on the substrate layer 1.

The luminescent layer 2 is disposed on the substrate layer 1, the black matrix layers 3 are disposed besides two sides of the luminescent layer 2 and are disposed on the substrate layer 1, and the light reflective layers 4 cover top and lateral sides of the black matrix layers 3.

A total thickness of each of the black matrix layers 3 and the light reflective layer 4 disposed thereon is less than 10 μm, thicknesses of the black matrix layers 3 are less than 2 μm, and thicknesses of the light reflective layers 4 range from 2 μm to 8 μm.

A plurality of micro LEDs are disposed in the luminescent layer 2, and the light reflective layers 4 may reflect light emitted from the micro LEDs to upper layers so that the light may be emitted from the top. Therefore, light emitted by the luminescent layer may be prevented from being absorbed by the black matrix layers 3, brightness may increase, and luminescent efficiency of devices may be improved.

In the present embodiment, the reflective layers 4 are made of Al and are formed by sputtering. In other embodiments, the reflective layers 4 may also be made of other metals having light reflective property. Alternatively, the reflective layers 4 may also be made of organic materials or non-organic materials that have light reflective property and can be used in patterning processes such as lithography, developing, and etching. It should be noted that materials of the reflective layers 4 are not limited here.

The substrate layer 1 includes a substrate 11, a buffer layer 12 disposed on the substrate 11, an active layer 13 disposed on the buffer layer 12, an insulating layer 14 disposed on the active layer 13, a gate layer 15 disposed on the insulating layer 14, an interlayer dielectric layer 16 disposed on the gate layer 15, a source/drain layer 17 disposed on the interlayer dielectric layer 16, a planarization layer 18 disposed on the source/drain layer 17, and a pixel electrode layer 19 disposed on the planarization layer 18.

The substrate 11, which is a substrate of a display panel, may be a glass substrate or a polyimide film. The polyimide film is an insulating film with exceptional performance and relatively strong tensile property. The polymide film may be formed by following steps: performing polycondensation reaction between pyromellitic dianhydride and diaminodiphenyl ether in a strong polar solvent to form a cast film, then performing imidization reaction on the cast film.

In the present disclosure, the insulating layer 14 is made of silicon nitride, while it may also be made of silicon oxide or silicon oxynitride. It should be noted that a material of the insulating layer 14 may be decided according to requirements and is not limited here. The planarization layer 18 is made of a transparent organic material with good elasticity and flexibility and can increase flatness and alleviate forces applied to layers.

Second Embodiment

Figure 3:
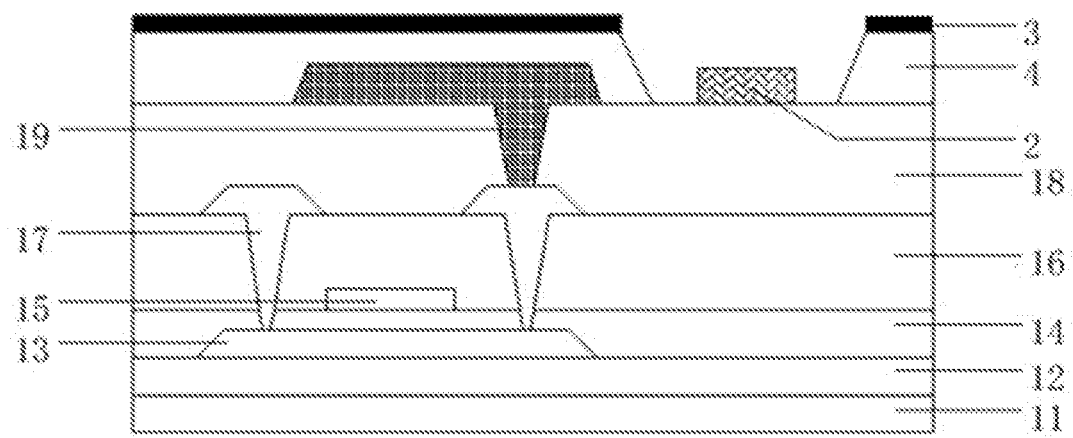
FIG. 3 is a schematic structural view showing a display panel provided by a second embodiment of the present disclosure.

Referring to FIG. 3, which is a schematic structural view showing a display panel provided by the present embodiment. The display panel provided by the present embodiment and the display panel provided by the first embodiment are roughly the same. Therefore, same structures can be referred to the above description and are not illustrated here again. A main difference between the present embodiment and the first embodiment is: in the present embodiment, the reflective layers 4 are disposed on the substrate layer 1, and the black matrix layers 3 are disposed on the reflective layers 4.

The reflective layers 4 can continuously reflect and utilize light that is emitted from luminescent layer 2 to the black matrix layers 3. Meanwhile, light emitted from the luminescent layer 2 is prevented from being absorbed by the black matrix layers 3 so that utilization rate of light may increase.

In the present embodiment, thicknesses of the light reflective layers 4 are greater than a thickness of the luminescent layer 2, thicknesses of the black matrix layers 3 are less than 2 μm, and thicknesses of the reflective layers 4 range from 2 μm to 8 μm.

Third Embodiment

Another objective of the present disclosure is to provide a display device, including a main body, and the display panel provided by the present disclosure is disposed on the main body.

Regarding beneficial effects: the present disclosure provides a display panel and a display device, a reflective layer is formed on a black matrix layer. Alternatively, it may also be that the black matrix layer having light-shading effect is disposed on the reflective layer. RGB chips can block light leaking from each other, and the light reflective layer can reflect light emitted from the luminescent layer to upper layers so that the light can be emitted from the top. As a result, light emitted from the luminescent layer can be prevented from being absorbed by the black matrix layer, thereby increasing brightness and improving luminescent efficiency of devices.

The above are merely preferred embodiments of the present invention. It is understood that many changes and modifications to the described embodiment can be carried out without departing from the scope and the spirit of the disclosure that is intended to be limited only by the appended claims.

What is claimed is:

1. A display panel, comprising a substrate layer, a luminescent layer, and a plurality of composite black matrix layers;
   wherein the luminescent layer is disposed on the substrate layer, the composite black matrix layers are disposed beside two sides of the luminescent layer and are disposed on the substrate layer, and each of the composite black matrix layers comprises a black matrix layer and a light reflective layers,
   wherein the black matrix layer is disposed on the substrate layer, the light reflective layer is disposed between the substrate layer and the black matrix layer, and
   wherein the light reflective layer and the luminescent layer are separated from each other, and do not overlap each other in a stacking direction along which the light reflective layer and the luminescent layer are stacked.

2. The display panel of claim 1, wherein a thickness of the black matrix layer is less than 10 μm.

3. The display panel of claim 1, wherein a thickness of the black matrix layer is less than 2 μm, and a thickness of the light reflective layer ranges from 2 μm to 8 μm.

4. The display panel of claim 1, wherein a thickness of the light reflective layer is greater than a thickness of the luminescent layer.

5. The display panel of claim 1, wherein the light reflective layer is made of metals or organic materials.

6. A display device, comprising a main body;
   wherein the display panel of claim 1 is disposed on the main body.

7. The display device of claim 6, wherein a thickness of the black matrix layer is less than 10 μm.

8. The display device of claim 6, wherein a thickness of the black matrix layer is less than 2 μm, and a thickness of the light reflective layer ranges from 2 μm to 8 μm.

9. The display device of claim 6, wherein a thickness of the light reflective layer is greater than a thickness of the luminescent layer.

10. The display device of claim 6, wherein the light reflective layer is made of metals or organic materials.

* * * * *